US012635283B2

(12) United States Patent
Haschke

(10) Patent No.: US 12,635,283 B2
(45) Date of Patent: May 19, 2026

(54) SOLAR CELL AND METHOD FOR FORMING THE SAME

(71) Applicant: REC Solar PTE. Ltd., Singapore (SG)

(72) Inventor: Jan Haschke, Singapore (SG)

(73) Assignee: REC Solar PTE. Ltd., Singapore (SG)

( * ) Notice: Subject to any disclaimer, the term of this patent is extended or adjusted under 35 U.S.C. 154(b) by 0 days.

(21) Appl. No.: 18/725,003

(22) PCT Filed: Dec. 9, 2022

(86) PCT No.: PCT/EP2022/085147
§ 371 (c)(1),
(2) Date: Jun. 27, 2024

(87) PCT Pub. No.: WO2023/126146
PCT Pub. Date: Jul. 6, 2023

(65) Prior Publication Data
US 2025/0072154 A1 Feb. 27, 2025

(30) Foreign Application Priority Data

Dec. 29, 2021 (GB) ...................................... 2119060

(51) Int. Cl.
*H10F 71/00* (2025.01)
*H10F 10/161* (2025.01)
(Continued)

(52) U.S. Cl.
CPC ......... *H10F 71/121* (2025.01); *H10F 10/161* (2025.01); *H10F 10/166* (2025.01); *H10F 71/129* (2025.01); *H10F 77/311* (2025.01)

(58) Field of Classification Search
CPC .... H10F 71/121; H10F 71/129; H10F 77/311; H10F 10/161; H10F 10/166; H10F 10/146
See application file for complete search history.

(56) References Cited

U.S. PATENT DOCUMENTS 9,780,253 B2 10/2017 Morad et al.
2012/0211079 A1* 8/2012 Hekmatshoar-Tabari ...................
H10F 71/00
136/258

(Continued)

FOREIGN PATENT DOCUMENTS

CN 103915523 A 7/2014
CN 105990470 A 10/2016
(Continued)

OTHER PUBLICATIONS

Temmler, Jan, et al. "Passivation and Microstructure of Dual Intrinsic a-Si:H Layers for SHJ Solar Cells", Proceedings of 36th European Photovoltaic Solar Energy Conference and Exhibition, EU PVSEC 2019. Sep. 9, 2019-Sep. 13, 2019, ISBN: 978-3-936338-60-7. (Year: 2019).*

(Continued)

*Primary Examiner* — Kourtney R S Carlson
(74) *Attorney, Agent, or Firm* — Lee & Hayes, P.C.

(57) ABSTRACT

A method for manufacturing a solar cell, the method comprising providing a substrate, arranging a passivation region on a surface of the substrate and arranging a collector layer on a surface of the passivation region, the step of arranging the passivation region comprises; depositing a first passivation layer on the surface of the substrate using a first gas; and, depositing a second passivation layer onto the surface of the first passivation layer using a second gas; wherein the first and second gases each comprise hydrogen gas and a silicon-based gas, wherein the ratio of hydrogen gas to silicon-based gas of the second gas is up to 2.5, and at least 0.4, times the ratio of hydrogen gas to silicon-based gas of the first gas.

20 Claims, 3 Drawing Sheets

(51) Int. Cl.
  H10F 10/166 (2025.01)
  H10F 77/30 (2025.01)

(56) References Cited

U.S. PATENT DOCUMENTS

| | | |
|---|---|---|
| 2013/0171757 A1 | 7/2013 | Ponnekanti et al. |
| 2015/0349170 A1 | 12/2015 | Morad et al. |
| 2015/0349703 A1 | 12/2015 | Morad et al. |
| 2016/0359080 A1 | 12/2016 | Chae et al. |
| 2022/0238748 A1* | 7/2022 | Chen ..................... H10F 71/129 |

FOREIGN PATENT DOCUMENTS

| | | | | |
|---|---|---|---|---|
| CN | 106098835 | A | * 11/2016 | ........... H10F 71/121 |
| CN | 110408854 | A | * 11/2019 | ............. C22C 38/06 |
| CN | 113113502 | A | 7/2021 | |
| CN | 214043687 | U | * 8/2021 | |
| EP | 3407391 | A1 | 11/2018 | |
| JP | 6916972 | B1 | 8/2021 | |
| KR | 20200085188 | A | 7/2020 | |

OTHER PUBLICATIONS

English machine translation of CN 106098835 (Year: 2016).*

English Machine Translation of CN-110408854-A (Year: 2019).*

English machine translation of CN214043687U (Year: 2021).*

Song, et al., "Cross-Sectional High-Resolution Transmission Electron Microscopy of the Microstruccture of Electrochromic Nickel Oxide," Solar Energy Matericals & Solar Cells, vol. 63, 2000, pp. 2274-235.

GB Search Report for GB Application No. GB2119060.8, mailed Jun. 6, 2022, 4 pages.

Search Report and Written Opinion for International Application No. PCT/EP2022/085147, mailed Feb. 28, 2023, 17 pages.

Rostan, Philipp Johannes, "a-Si: H/c-Si Heterojunction Front-and Back Contacts for Silicon Solar Cells with P-Type Base," Institute for Physical Electronics at the University of Stuttgart, 2010, 141 pages.

Voz, et al., "Microdoping Compensation of Microcrystalline Silicon Obtained by Hot-Wire Chemical Vapour Deposition," Solar Energy Materials & Solar Cells, vol. 63, 2000, pp. 237-246.

* cited by examiner

SOLAR CELL AND METHOD FOR FORMING THE SAME

CROSS-REFERENCE TO RELATED APPLICATIONS

This application is a U.S. National Phase Patent Application based on International Patent Application No. PCT/EP2022/085147, filed Dec. 9, 2022; which claims priority to GB Patent Application No. 2119060.8, filed Dec. 29, 2021. The above referenced applications are incorporated herein by reference in their entirety as if fully set forth herein.

FIELD OF THE DISCLOSURE

The present disclosure relates to solar cells and methods for forming the same.

BACKGROUND

Solar modules for providing electrical energy from sunlight comprise an array of solar/photovoltaic cells, each comprising a multi-layer semiconductor structure arranged between one or more front and back electrodes.

The substrate typically forms a p-n junction with a minority charge carrier collector layer (i.e. one of the substrate and the minority charge carrier collector layers being an n-type material and the other being a p-type material), which facilitates the generation of an electric current in response to light incident on the solar cell.

The solar cell can also include a majority charge carrier collector layer arranged on an opposite portion of the substrate to the minority charge carrier collector layer and is configured to extract charge carriers from the substrate. The front electrode is electrically connected to the minority charge carrier collector layer (e.g. electron collector layer) and the back electrode is electrically connected to the majority charge carrier collector layer (e.g. hole collector layer).

The minority and majority charge carrier collector layers are typically formed of amorphous silicon (a-Si) whereas the substrate is formed of crystalline silicon (c-Si) to form a heterojunction technology (HJT) solar cell.

To maximise the efficiency of such solar cells, it is important to minimise the number of surface defects which can form at the interfaces between the different layers of the multilayer structure. Surface defects typically consist of strained, or unterminated, bonds (also referred to as dangling bonds), which form within the semiconductor layers. Charge carriers can recombine at surface defects, instead of being collected by the electrodes, which leads to a decrease in the photovoltaic conversion efficiency of the solar cell.

Accordingly, there is a need to reduce the prevalence of charge carrier recombination within such solar cells, whilst also improving the charge carrier transport properties at the interface between the silicon substrate and the minority and majority charge carrier collector layers.

SUMMARY

According to a first aspect there is provided a method of manufacturing a solar cell, the method comprising providing a substrate, arranging a passivation region on a surface of the substrate and arranging a collector layer on a surface of the passivation region, the step of arranging the passivation region comprises; depositing a first passivation layer on the surface of the substrate using a first gas; and, depositing a second passivation layer onto the surface of the first passivation layer using a second gas; wherein the first and second gases each comprise hydrogen gas and a silicon-based gas, wherein the ratio of hydrogen gas to silicon-based gas of the second gas is up to 2.5 and at least 0.4 times the ratio of hydrogen gas to silicon-based gas of the first gas.

It will be understood that the ratio of hydrogen gas to silicon-based gas of a source gas (e.g. the first and second gases) may define a 'hydrogen gas ratio' of the source gas, as will be referred to herein. In this way, the hydrogen gas ratio of the second gas may be between at least 0.4 times (i.e. at least 40%) and up to 2.5 times (i.e. up to 250%) the hydrogen gas ratio of the first gas. Put another way, the ratio between the hydrogen gas ratio of the second gas and the hydrogen gas ratio of the first gas may be up to 2.5 and/or at least 0.4. In the exemplary situation where the hydrogen gas ratio of the second gas is 0.4 times the hydrogen gas ratio of the first gas, then it will be understood that the concentration of hydrogen gas (relative to silicon-based gas) of the second gas is 0.4 times the concentration of hydrogen gas (relative to silicon-based gas) of the first gas.

The hydrogen gas ratios of the source gases according to the present invention are advantageously configured to cause densification of the respective first and second passivation layers, which thereby improves the film quality of the passivation region, leading to an increase in the conversion efficiency of the solar cell.

It will be understood that the first and second passivation layers define separate passivation layers, which are deposited in separate deposition steps (e.g. a first deposition step and a second deposition step, respectively). For example, the first passivation layer may be deposited in a first deposition chamber, and the second passivation layer may be deposited in a second deposition chamber, which is different to the first deposition chamber.

It is known that the negative effects of charge carrier recombination within the semiconductor layers, and at the interfaces therebetween, can be reduced by passivating the defects formed. Typically, this may be achieved by providing a 'passivation layer' of intrinsic (i.e. non-doped) semiconductor material between the substrate and the collector layer (e.g. an electron or hole-collector layer).

Such a known passivation layer may form a dielectric coating on the silicon substrate which chemically neutralises the dangling surface bonds—i.e. 'chemical passivation'. This type of chemical passivation can be enhanced by introducing additional passivating species, such as hydrogen, into the intrinsic material during the deposition of the passivation layer.

The presence of a single passivation layer, while beneficial, may also result in the formation of additional interfaces within the solar cell, e.g. between the passivation layer and the overlying collector layer, which can increase the number of defect sites. This problem can be exacerbated if the passivation layer is too thin, leading to increased charge carrier recombination within the solar cell. Conversely, if the passivation layer is too thick, then its presence within the solar cell structure can inhibit transportation of charge carriers towards the electrodes.

It is known to expose the passivation layer of the solar cell to a hydrogen plasma treatment in order reduce defects both in the bulk of the layer and at its interfaces with other layers of the solar cell. The charged hydrogen ions which are formed during a known hydrogen plasma treating process can only penetrate a short distance into the treated semiconductor layer and, thus, can provide only limited passivation of the underlying bulk material.

In some cases, hydrogen plasma etching (or treating) can cause non-uniform passivation across the surface of the treated semiconductor layers. This can be a particular issue when multiple silicon substrates are arranged within a deposition chamber. Over time, the effects of the hydrogen plasma etching can lead to different levels of etching being performed on the silicon substrates, depending on where they are positioned in the chamber. This variation in the etching performance can cause significant variations in the conversion characteristics, particularly in open circuit voltage (Voc), of the final solar cells.

It has been determined by the inventors of the present invention that by controlling the hydrogen gas ratio of the source gases (e.g. the first and second gases), then the density of the first and second passivation layers can be increased to provide increased passivation of the interfaces within the solar cell, such that the hydrogen plasma etching can be avoided.

In particular, by configuring the hydrogen gas ratio of the second passivation layer so as to be substantially within a range of 0.4 and 2.5 times the hydrogen gas ratio of the first passivation layer, the inventors have determined that the resulting bi-layered passivation region is formed with a greater density (e.g. comprising a less porous structure). The passivity of the bulk material of the passivation region provides a more uniform passivation across a length, width, and depth of the film. The overall effect of the resulting bi-layered passivation region (i.e. including the first and second passivation layers) is a solar cell which exhibits an increased fill-factor.

A consequence of the method of present invention is that it may result in a slight reduction in the deposition rate for the second passivation layer, compared with an equivalent passivation layer that is deposited using a gas which has a significantly lower hydrogen concentration (e.g. a hydrogen concentration which is at least an order of magnitude lower than that of the first gas). Using such a low hydrogen concentration gas can increase the speed of deposition, but it may also lead to a situation in which a hydrogen plasma treatment is needed to enhance the passivating properties of the resulting layer (e.g. by performing a plasma treatment prior to depositing the passivation layer). By contrast, the method according to the present invention is advantageously configured such that the hydrogen gas ratio of the second gas is such that it produces a highly passivating second passivation layer, which does not require a hydrogen plasma treatment. Thus, the increased passivation of the second layer more than offsets any potential reduction in deposition speed.

It will be understood that when an element such as a layer, film, region, or substrate is referred to as being "on", "adjacent" or "opposite" to an element, it can be "directly on", "directly adjacent" or "directly opposite" to that further element; alternatively, there may be one or more intervening elements present. In contrast, when an element is referred to as being "directly on", "directly adjacent" or "directly opposite" another element, there are no intervening elements present.

Optional features will now be set out. These are applicable singly or in any combination with any aspect.

It will be appreciated that etching defines an at least partially subtractive manufacturing process, which entails the removal of material from the surface which is being etched. The hydrogen plasma etching may define a process which is at least partially subtractive but also at least partially additive because hydrogen atoms are deposited upon, and into, the layer which is being treated, e.g. by passivating dangling bonds which are present on the surface of the passivation layer. The amount of material removed by etching may be more than the amount of material added by etching. In this way, hydrogen plasma etching may be defined as a surface passivation treatment.

The method of arranging the passivation region may comprise not etching at least one of the first and second passivation layers with a hydrogen plasma. In this way, neither the first nor the second passivation layer is treated, or etched, with a hydrogen plasma during the method.

In embodiments, the method may comprise not etching the first and/or second passivation layers with any form of plasma. The method may further comprise not treating the first and/or second passivation layers with a hydrogen plasma. Furthermore, the method may comprise not treating the first and/or second passivation layers with any form of surface passivation treatment.

The ratio of hydrogen gas to silicon-based gas of the second gas may be between 0.75 and 1.5 times the ratio of hydrogen gas to silicon-based gas of the first gas. In embodiments, the method may comprise configuring the first and second gases such that their respective ratios of hydrogen gas and silicon-based gas are substantially the same. In this way, the first gas is configured such that the level of hydrogen gas which is introduced into the deposition chamber during the deposition of the first passivation layer is substantially the same as that which is present during deposition of the second passivation layer. Accordingly, the resulting first and second passivation layers may be configured with substantially the same hydrogen gas ratio (e.g. percentage or proportion of hydrogen), which increases the density of the passivation region and thereby enhances the passivation of the interface between the passivation region (e.g. the first and second passivation layers) and the collector layer which is deposited thereon.

The method may comprise configuring the first gas such that the ratio of hydrogen gas to silicon-based gas is up to 50 and/or at least 20. In this way, the first gas may be configured such that there is up to fifty times, and/or at least twenty times, the amount of hydrogen gas than the amount of silicon-based gas present in the deposition chamber during the deposition of the first passivation layer.

In embodiments, the first gas may be configured such that the ratio of hydrogen gas to silicon-based gas is up 35 and/or at least 25. The method may comprise configuring the second gas such that the ratio of hydrogen gas to silicon-based gas is up to 50 and/or at least 20. In embodiments, the second gas may be configured such that the ratio of hydrogen gas to silicon-based gas is up 35 and/or at least 25. At least one, or each, of the first and second gases may be configured such that the ratio of hydrogen gas to silicon-based gas is approximately 32.

In embodiments the second passivation layer may be deposited directly onto the first passivation layer such that there is no interposing layer, or element, arranged therebetween. This contrasts with the situation in which a passivation layer is treated with a hydrogen plasma, wherein the hydrogen plasma may cause the formation, or build-up, of hydrogen atoms on the exposed surface of the passivation layer. Accordingly, it will be appreciated that any subsequent layer which is deposited onto the plasma treated surface would not be deposited 'directly' onto the passivation layer, but instead would be deposited onto the build-up of hydrogen atoms which are formed thereon by the hydrogen plasma treatment.

In embodiments, the passivation region may comprise a third passivation layer interposed between the first passivation layer and the substrate. The method of manufacturing the solar cell may comprise depositing the third passivation layer onto the surface of the substrate using a third gas comprising hydrogen gas and a silicon-based gas. The method may comprise depositing the third passivation layer prior to depositing the first and second passivation layers.

The ratio of hydrogen gas to silicon-based gas of the third gas may be up to 0.1 times the ratio of hydrogen gas to silicon-based gas of at least one of the first and second gases. In embodiments the ratio of hydrogen gas to silicon-based gas of the third gas may be up to 0.01 times the ratio of hydrogen gas to silicon-based gas of at least one of the first and second gases. The method may comprise configuring the third gas such that the ratio of hydrogen gas to silicon-based gas is up to 1. In embodiments, the third gas may be configured such that the ratio of hydrogen gas to silicon-based gas is approximately 0 (e.g. 0), i.e. substantially pure silicon-based gas. Put another way, the third gas may contain only trace amounts of hydrogen gas.

It will be understood that the collector layer defines a charge carrier collector layer of the solar cell. Accordingly, the collector layer may be configured to collect charge carriers (e.g. electrons and holes) which are generated due to the absorption of incident light, when the solar cell is in use. Depending on how the solar cell's components are configured (e.g. the conductivity type of the collector layer and substrate) the electrons and holes may define minority or majority charge carriers, when the solar cell is in operation.

The passivation region and the collector layer may, together, define at least part of a layered structure which is arranged on a surface of the substrate. For example, the layered structure may be arranged opposite a back surface of the substrate (i.e. a back layered structure), which is configured to not face a radiative source (e.g. the sun), when the solar cell is in use. Alternatively, the layered structure may be arranged on the front surface of the substrate, upon which light from a radiative source is incident during normal use (i.e. a front layered structure).

It will be appreciated that the layered structure may comprise one or more collector layer(s) without diverting from the scope of the present invention.

When the layered structure is a back layered structure it may comprise a back-collector layer and a back-passivation region, comprising a back first and second passivation layers. Similarly, when the layered structure is a front layered structure, it may comprise a front collector layer and a front-passivation region, comprising front first and second passivation layers.

The method of manufacturing the solar cell may comprise arranging the substrate in a deposition chamber and then depositing at least one or each of the regions and layers of the solar cell onto the substrate using a vapour deposition process in which one or more gases are introduced into the deposition chamber so as to form chemical species which are deposited onto a surface of the substrate. The deposition process may be a chemical vapour deposition process (CVD), e.g. a plasma enhanced chemical vapour deposition process (PECVD), as would be understood by the skilled person. Each of the layers of the passivation region, and/or the collector layer, may be deposited using the same deposition method as a part of a single continuous process. It will be understood that although they are deposited using a similar deposition method, at least one (or each) of the passivation layers (and/or collector layers) may be deposited in different deposition steps, and/or in different deposition chambers.

The method of depositing the passivation region may comprise first depositing the first passivation layer onto a surface of the substrate and then depositing the second passivation layer onto an exposed surface of the first passivation layer. In this way, the first and second passivation layers may be deposited sequentially to form the passivation region.

The method of arranging the collector layer may comprise, once the passivation region has been formed on the substrate, depositing the collector layer onto an exposed surface of the passivation region (e.g. the second passivation layer), such that the passivation region is interposed between the substrate and the collector layer. The method of depositing the collector layer may comprise depositing the collector layer on the surface of the passivation region using a fourth gas. The fourth gas may be different to at least one, or each, of the first, second and third gases.

At least one, or each, of the gases used to deposit the layers of the solar cell may be comprised of a plurality of gas species, or constituent gases, (e.g. gases having different chemical compositions). For example, the first gas may define a first gas mixture including hydrogen gas and silicon-based gas. For example, the second gas may define a second gas mixture including hydrogen gas and silicon-based gas.

Each of the gas mixtures may be formed by mixing a plurality of constituent gases before they are introduced into the deposition chamber. Alternatively, the constituent gases may be mixed within the deposition chamber. At least one, or each, of the first, second and third gases, i.e. the source gases, may comprise a silicon containing gas, such as $SiH_4$ or $Si_2H_6$. At least one, or each, of the source gases may also comprise hydrogen gas ($H_2$).

The method may comprise controlling at least one parameter of the deposition process to determine the structural and/or chemical composition of at least one of the layers of the passivation region, and/or the collector layer.

The at least one parameter may comprise at least one of a gas flow rate, a gas pressure, a temperature of the deposition chamber, a temperature of the deposition chamber, and a power density of a plasma enhanced deposition process. In particular, the least one deposition parameter may determine the ratio of hydrogen gas to silicon-based gas of the first and second passivation gases. For example, the ratio between the hydrogen gas and the silicon-based gas may be determined by the relative volume fraction of the respective gases that are introduced into the deposition chamber.

In situations where the deposition process comprises a plasma enhanced vapour deposition process, a parameter of the deposition process may define the power density of the plasma which is induced during the deposition of the solar cell layers. Alternatively, this parameter may be defined as the radio frequency (RF) power which is used to form the plasma in the deposition chamber.

According to an exemplary method, the at least one (or each) deposition parameter(s) associated with the first passivation layer may be substantially the same as the corresponding at least one (or each) deposition parameter(s) of the second passivation layer.

The method may comprise depositing the first and second passivation layers with substantially the same gas pressure and power density deposition parameters. In embodiments, the gas pressure may be approximately 1.9 mbar and the power density may be approximately 21 mW/cm². The hydrogen ratio of the third gas may be substantially zero. Put another way, the third gas may comprise no hydrogen gas, and instead may be comprised of silicon-based gas only. The gas pressure and power density deposition parameters of the third passivation layer may be substantially different to that of the first and second passivation layers. In embodiments, the gas pressure may be approximately 1.2 mbar and the power density may be approximately 60 mW/cm$^2$.

Each of the layers may be configured with a width, a length, and a depth. The width and length of each layer may be measured in perpendicular directions that are aligned with the surface of the substrate upon which they are arranged. For each layer, its width and length may be substantially greater than its depth, which may be measured in a direction that is perpendicular to the substrate surface.

The method may comprise configuring the passivation region with a depth of less than 25 nm, optionally at least 5 nm. The method may comprise configuring the first passivation layer with a depth of less than 8 nm and at least 2 nm. The method may comprise configuring the second passivation layer with a depth of less than 9 nm and at least 3 nm. According to an exemplary arrangement, the first passivation layer may comprise a depth of approximately 5 nm, the second passivation layer may comprise a depth of approximately 6 nm. The method may comprise configuring the third passivation layer with a depth of less than 5 nm and at least 2 nm, optionally at least 3 nm. The method may comprise configuring the collector layer with a depth of less than 30 nm and at least 5 nm.

The at least one parameter of the deposition process may be configured to determine other aspects of the passivation region layers and/or collector layer. For example, a deposition rate for each of the layers may be determined by controlling one of the deposition parameters. The deposition rate may be defined as the depth of the layer (e.g. as measured in nanometres) which is deposited onto a smooth surface over time (e.g. as measured in seconds). The deposition rate of the first passivation layer may be substantially the same as the deposition rate of the second passivation layer. The deposition rate of the first and second passivation layers may be at least 0.03 nm/sec.

As described above, the method may comprise controlling the at least one parameter of the deposition process to determine the chemical composition of at least one of the layers of the passivation region, and/or the collector layer.

The method may comprise configuring at least one, or each, of the passivation layers and the collector layer such that they are substantially formed of a semiconductor material. At least one, or each, of the layers may be formed of amorphous silicon. It will be appreciated that the term 'amorphous silicon' is used herein to refer to a silicon-based amorphous semiconductor material. Examples of the silicon-based material include silicon alloys such as silicon carbide, silicon nitride and silicon germanium in addition to silicon. As such, each of the layers may be comprised of additional elements in combination with silicon. This is contrast to the substrate which may be formed of a substantially crystalline silicon material, e.g. monocrystalline or polycrystalline silicon.

The method may comprise controlling at least one parameter of the deposition process to determine a conductivity type of at least one of the passivation layers and the collector layer. The conductivity type may be determined by the inclusion of dopant atoms. It will be understood that the ionisation state of the dopant atoms may determine the conductivity type of the doped semiconductor material. For example, the semiconductor material may be positively or negatively doped to exhibit a positive conductivity type (p-type) or a negative conductivity (n-type), respectively.

The method may comprise configuring the conductivity type of at least one of the layers to be p-type or n-type. The method may comprise configuring at least one of the layers such that it is substantially non-doped (i.e. intrinsic), which may be determined by the omission of dopant atoms.

The method may comprise configuring the first and/or third passivation layer(s) to be non-doped and configuring the second passivation layer with a conductivity type which is determined by the inclusion of dopant atoms. Advantageously, the second passivation layer may be doped to increase the conductivity of the passivation region at its interface with the collector layer.

The method may comprise configuring the collector layer with the same conductivity type as the second passivation layer upon which it is deposited. Doping the second passivation and collector layers with the same conductivity type improves the flow of charge carriers between the passivation region and the collector layer.

The method may comprise configuring the collector layer and the second passivation layer with a positive conductivity type (i.e. p-type). Alternatively, the method may comprise configuring the collector layer and the second passivation layer with a negative conductivity type (i.e. n-type).

The method may comprise controlling at least one parameter of the deposition process to determine a dopant concentration of the second passivation layer and/or the collector layer. The method may comprise configuring a dopant concentration of the second passivation layer to be less than the dopant concentration of the collector layer. Put another way, a second passivation layer dopant concentration may be less than a collector layer dopant concentration. In this way, the second passivation layer provides an intermediate doping layer which can bridge between the non-doped first passivation layer and the more highly doped collector layer. The dopant concentration of the second passivation layer may be configured such it may be defined as a micro-doped passivation layer. The method may comprise growing at least one of the second passivation layer and the collector layer with a dopant gas (e.g. by growing the layer in the presence of a dopant gas). The relative dopant concentrations of the second passivation and collector layers may be configured by controlling the concentration of dopant gas in the deposition chamber, e.g. by controlling the ratio of a dopant gas to silicon-based gas being introduced into the chamber.

In instances where the second passivation and/or collector layers are configured to be p-type, then the respective source gas may comprise a positive dopant gas, such as B2H$_6$. TMB or BF$_3$. Where the second passivation and/or collector layers are configured to be n-type, then the respective source gases may comprise a negative dopant gas, such as PH$_3$.

Any layer may be configured with a determined conductivity type (e.g. p-type or n-type). In some cases, the semiconductor material may not be doped (e.g. such as with the intrinsic first passivation layer).

The substrate may be configured with a first conductivity type (e.g. n-type) and the layered structure may comprise a collector layer which is configured with a second conductivity type (e.g. a p-type) that is opposite the first conductivity type, and thus forms a p-n junction along with the substrate. According to such an arrangement, the collector layer may define a minority charge carrier collector layer (e.g. a hole-collector layer) of the solar cell.

The method may comprise depositing the first and second passivation layers in separate deposition chambers (a.k.a. processing units). The first passivation layer may be deposited in a first chamber and the second passivation layer may be deposited in a second chamber. In this way, the method is able to prevent the unwanted introduction of conductive dopant atoms into the first chamber which may contaminate the deposition of the first passivation layer. Accordingly, the third passivation layer may be deposited in the first deposition chamber. Also, the collector layer may be deposited in the second deposition chamber. Alternatively, the collector layer may be deposited in a third deposition chamber.

During operation of the solar cell, a plurality of electron-hole pairs are produced by light incident on the substrate. When the substrate is n-type and the minority charge carrier collector layer is p-type (e.g. a hole-collector layer), the separated holes and electrons move to the p-type hole-collector layer and the n-type substrate, respectively. Accordingly, the holes operate as majority charge carriers in the p-type hole-collector layer, and the electrons operate as majority charge carriers in the n-type substrate.

According to an alternative arrangement, the substrate may be p-type and the minority charge carrier collector layer may be n-type (e.g. an electron-collector layer), thus forming a p-n junction with the substrate. In this instance, the separated electrons and holes move to the n-type electron-collector layer and the p-type substrate, respectively.

According to an exemplary arrangement, the substrate may be formed from an n-type monocrystalline silicon wafer. At least one of the layers of the layered structure (e.g. the collector layer) may comprise an amorphous material which is at least partially doped to be p-type.

Such an arrangement may contribute towards the formation of a heterojunction technology (HJT) type solar cell, which is so defined because it combines two different materials to create a charge separating p-n junction. Accordingly, the method may comprise forming a heterojunction type (HJT) solar cell. Alternatively, the method may comprise forming a multi-junction (e.g. tandem) solar cell, which is so defined because it comprises two or more charge separating junctions and two or more charge-generating photon absorbing layers.

The first passivation layer may be configured with no conductivity type such that it forms an intrinsic layer (e.g. non-doped) between the collector layer and the substrate.

When the semiconductor material is n-type, it may be configured to contain impurities of a group V element such as phosphor (P), arsenic (As), and antimony (Sb). When the semiconductor material is p-type, it may contain impurities of a group III element such as boron (B), gallium (Ga), and indium (In).

The collector layer may define a majority charge carrier collector layer configured with the first conductivity type (e.g. n-type), which is the same as that of the substrate. For example, both the substrate and the majority charge carrier collector layer may be n-type, such that the majority charge carrier collector layer defines an electron-collector layer. As such, the majority charge carrier collector layer may be configured to selectively screen, or extract, charge carriers from the substrate. Accordingly, when the solar cell is in use, the electrons produced by light incident on the substrate may be collected in the electron-collector layer, wherein they operate as majority charge carriers.

According to an exemplary embodiment, the method may comprise depositing the passivation region onto the back surface of the substrate. Accordingly, the collector layer may be deposited onto a back surface of the passivation region.

In embodiments, the method may comprise texturing the surface(s) of the substrate to form a textured surface corresponding to an uneven surface or having uneven characteristics. In this instance, an amount of light incident on the substrate increases because of the textured surface of the substrate, and thus the efficiency of the solar cell may be improved.

The solar cell may further comprise an anti-reflection layer, or coating, and/or a transparent conductive oxide layer, which may be arranged on a surface of the collector layer. The method may comprise arranging an anti-reflection layer, and/or a transparent conductive oxide layer on an exposed surface of the collector layer. The method of depositing the anti-reflection, and/or transparent conductive oxide, coating may comprise magnetron sputtering, or any other suitable deposition method.

The solar cell may further comprise an electrode, which may be arranged on a surface of the layered structure. The method may further comprise arranging an electrode onto the layered structure. The layered structure may comprise a back (e.g. backmost) surface and a front (e.g. frontmost) surface being opposite the back surface. Accordingly, when the layered structure is arranged on the back surface of the substrate, the method may comprise arranging an electrode onto the back surface of the layered structure to define a back electrode. When the layered structure is arranged on the front surface of the substrate, the method may comprise arranging an electrode onto the front surface of the layered structure to define a front electrode. In an alternative exemplary arrangement, the solar cell may comprise an interdigitated back contact solar cell. Therefore, the method may comprise arranging the electrodes on the back of the solar cell, as would be understood by the skilled person.

The, or each, electrode may comprise a plurality of finger electrodes and so the method may comprise depositing a plurality of finger electrodes onto the layered structure. The method may comprise depositing an electrically conductive material onto a front or back surface of the layered structure. The electrically conductive material may be deposited by various methods including evaporation, plating, printing etc. For example, the electrically conductive material may comprise a printed material. The method of depositing the electrically conductive material may comprise printing a printable precursor of the printed material onto the surface of the layered structure. The method may further comprise curing the printable precursor according to a firing process to form the finger electrodes.

The solar cell may comprise a front layered structure and a back layered structure arranged on a front and back surface of the substrate, respectively, the solar cell may comprise a front electrode arranged on the front surface of the front layered structure and a back electrode arranged on the back surface of the back layered structure. Each electrode may be configured to form an ohmic contact with the respective surfaces of the front and back layered structures.

According to an exemplary method for manufacturing a solar cell, the method may comprise providing a substrate, arranging a front layered structure on a front surface of the surface and arranging a back layered structure on a back surface of the substrate. The substrate may be doped to be n-type. The front and back layered structures may each comprise a passivation region and a collector layer.

The front-passivation region may comprise a first passivation layer and a second passivation layer, the first passivation layer being interposed between the second passivation layer and the substrate. The front-passivation region may be configured so as not to comprise a third passivation layer. The first front-passivation layer may be non-doped. The second front-passivation layer and the front-collector layer may be doped to be n-type. Accordingly, the first front-passivation layer may define a non-doped portion of the front-passivation region and the second front-passivation layer may define a micro-doped portion of the front-passivation region.

The back-passivation region may comprise a first back-passivation layer and a second back-passivation layer which is interposed between the first back-passivation layer and the back-collector layer. The back-passivation region may further comprise a third back-passivation layer interposed between the first back-passivation layer and the substrate. The first and third back-passivation layers may be non-doped, and the second back-passivation and back-collector layer may be doped to be p-type. Accordingly, the first and third back-passivation layers may, together, define a non-doped portion of the back-passivation region and the second back-passivation layer may define a micro-doped portion of the back-passivation region.

The method of depositing the back-passivation region may comprise depositing the first, second and third back-passivation layers using a first, second, and third gas, respectively. The hydrogen ratio of the second gas may be up to 2.5, and at least 0.4, times the hydrogen ratio of the first gas. The hydrogen ratio of the third gas may be up to 0.1 times the hydrogen ratio of at least one, or each, of the first and second gases.

The method of depositing the front-passivation region may comprise depositing the first and second front-passivation layers using the source gases which are different to each other, and/or different to the first, second and third gases used to deposit the back-passivation region.

According to a second aspect there is provided a solar cell manufactured according to the method of any one of the preceding paragraphs.

The solar cell may comprise a substrate, a passivation region arranged on a surface of the substrate and a collector layer arranged on a surface of the passivation region. In this way, the passivation region may be interposed between the substrate and the collector layer. The passivation region may comprise a first passivation layer arranged on the surface of the substrate and a second passivation layer arranged onto a surface of the first passivation layer. The first passivation region may be deposited, e.g. depositable, using a first gas. The second passivation region may be deposited, e.g. depositable, using a second gas without treating the surface of the first passivation layer with a hydrogen plasma. The first and second gases may each comprise hydrogen and a silicon-based gas. The ratio of hydrogen gas to silicon-based gas (e.g. the percentage or proportion of hydrogen gas) in the second gas may be up to 2.5 and at least 0.4 times the ratio of hydrogen gas to silicon-based gas (e.g. the percentage or proportion of hydrogen gas) in the first gas.

The passivation region may comprise a third passivation layer interposed between the first passivation layer and the collector layer. The third passivation layer may be deposited, e.g. depositable, by a third gas which is different to the first and second gases. The third gas may comprise hydrogen gas and a silicon-based gas. The ratio of hydrogen gas to silicon-based gas of the third gas may be up to 0.1 times the ratio of hydrogen gas to silicon-based gas of at least one of the first and second gases.

The collector layer may be deposited, e.g. depositable, by a fourth gas which is different to the first, second and third gases. The fourth gas may comprise hydrogen and a silicon-based gas.

The first passivation layer may not be configured with a conductivity type, i.e. it may be non-doped, or intrinsic. At least one, or each, of the second passivation layer and the collector layer may be configured with a conductivity type (e.g. n-type or p-type) based on the inclusion of conductive dopant atoms. The concentration of conductive dopant atoms of the second passivation layer may be less than the conductive dopant concentration of the collector layer.

The second passivation layer may be micro-doped with dopant atoms to increase its conductivity.

In embodiments, the solar cell may be configured to define a heterojunction type (HJT) solar cell. Alternatively, the solar cell may be configured to define a multi-junction solar cell.

The solar cell may further comprise an anti-reflection layer, or coating, arranged opposite the collector layer (e.g. such that the collector layer is interposed between the anti-reflection layer and the substrate). The anti-reflection layer may comprise a single layer, or it may be formed of multiple layers, as would understood by the skilled person.

The anti-reflection layer may be formed of a transparent conductive oxide (TCO) material, such as indium tin oxide (ITO). A surface of the substrate (e.g. the substrate's front and/or back surface(s)) may be textured. Each of the layers within the layered structure may substantially conform with the substrate's textured surface, such that the anti-reflection layer defines a textured outer surface of the solar cell (e.g. the solar cell's front and/or back surface). The anti-reflection layer advantageously reduces the reflectance of light incident on the solar cell and increases selectivity of a predetermined wavelength band, thereby increasing the efficiency of the solar cell.

The solar cell may comprise an electrode arranged opposite the layered structure and configured to extract photo-generated charge carriers from the solar cell. The electrode may be arranged such that the layered structure is interposed between the electrode and the substrate. The TCO layer (e.g. the anti-reflection layer) may be electrically connected to the collector layer. The TCO layer may be configured to increase lateral carrier transport to the electrode arranged on the respective surface of the layered structure. In this configuration, the TCO layer (e.g. the anti-reflection layer) may be interposed between the electrode and the collector layer.

When the layered structure is arranged on a back (e.g. backmost) surface of the substrate, the electrode may be arranged on a back surface of the layered structure, to define a back electrode of the solar cell.

When the layered structure is arranged on a front (e.g. frontmost) surface of the substrate, the electrode may be arranged on a front surface of the layered structure, to define a front electrode of the solar cell.

When the solar cell comprises a front layered structure and a back layered structure arranged on a front and back surface of the substrate, respectively, the solar cell may comprise a front electrode arranged on the front surface of the front layered structure and a back electrode arranged on the back surface of the back layered structure. Each electrode may be configured to form an ohmic contact with the respective surfaces of the front and back layered structures.

The front and back electrodes may each comprise a plurality of finger electrodes which are arranged on the respective surfaces of the passivation regions. Each finger electrode may be configured with an axial length which is substantially greater than its width. Both the width and axial length of the finger electrode may be measured in perpendicular directions in the plane of the respective surface of the passivation region. The finger electrodes may extend in a transverse direction which is parallel with the width direction of the passivation region.

The finger electrodes within each of the pluralities of front and/or back finger electrodes may be spaced apart across the respective surfaces to define transversely extending spaces between the finger electrodes. The finger electrodes may be spaced apart in a longitudinal direction which is substantially parallel with the length direction of the passivation region. The finger electrodes in each plurality may be substantially parallel to one another. Accordingly, the plurality of back finger electrodes may form an array of parallel, longitudinally spaced (e.g. equally spaced) finger electrodes.

It will be understood that the terms 'conductive' and 'insulating' as used herein, are expressly intended to mean electrically conductive and electrically insulating, respectively. The meaning of these terms will be particularly apparent in view of the technical context of the disclosure, being that of photovoltaic solar cell devices. It will also be understood that the term 'ohmic contact' is intended to mean a non-rectifying electrical junction (i.e. a junction between two conductors which exhibits a substantially linear current-voltage (I-V) characteristic).

According to an exemplary arrangement, the solar cell may comprise a substrate, a front layered structure arranged on a front surface of the substrate and a back layered structure arranged on a back surface of the substrate. The back layered structure may define an p-type hole-collector (or hole-collector layer) of the solar cell, being positioned opposite the n-type substrate to form a p-n junction. The hole-collector may be electrically connected to a back electrode and arranged such that the hole-collector is arranged between the back electrode and the substrate. The front layered structure may define an n-type electron-collector (or electron-collector layer), being positioned toward the front surface of the substrate, i.e. between the substrate and a front electrode. The electron-collector may be configured to extract charge carriers from the substrate and transfer them to the front electrode during operation of the solar cell.

According to a third aspect there is provided a solar module comprising a plurality of solar cells according to the second aspect. The plurality of solar cells may be electrically coupled together.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the Figures, in which.

DETAILED DESCRIPTION

Aspects and embodiments of the present disclosure will now be discussed with reference to the accompanying figures. Further aspects and embodiments will be apparent to those skilled in the art.

Figure 1:
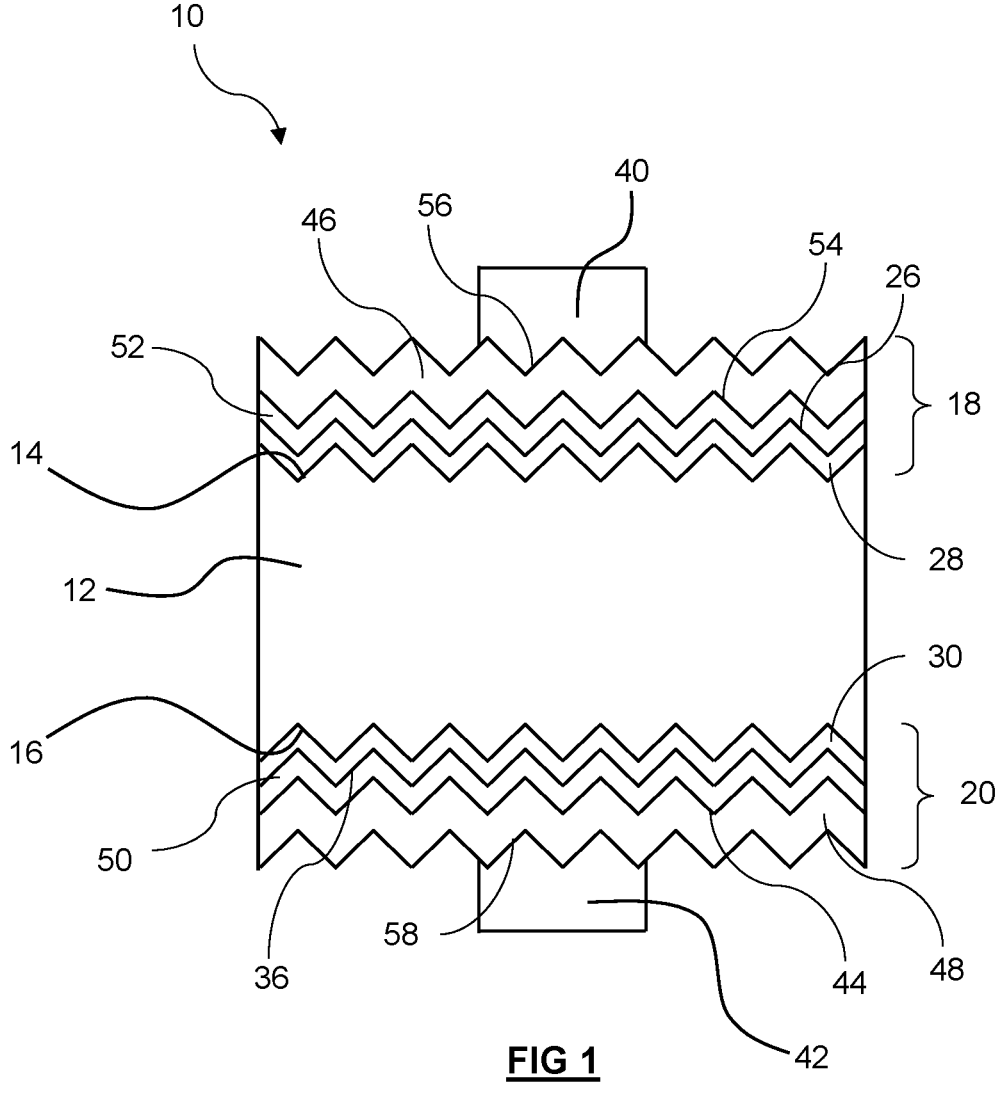
FIG. 1 is a schematic illustrating the layers of a solar cell.

FIG. 1 schematically illustrates a solar cell 10 comprising, among other layers, a semiconductor substrate 12 comprising a first (i.e. front) surface 14, upon which light from a radiative source (e.g. the sun) is incident during normal use, and a second (i.e. back) surface 16 that is opposite the front surface 14. That is, the front surface 14 may be configured in use to face the sun, whereas the back surface 16 may be configured in use to face away from the sun.

The substrate 12 divides the solar cell 10 into a front portion 18 that is forward (i.e. in front of) of the substrate 12, and a back portion 20 that is rearward of the substrate 12. Light incident on the solar cell 10 passes through the front portion 18, the substrate 12 and then the back portion 20. Alternatively, light may also be incident on the solar cell 10 from a rearward direction such that it passes first through the back portion 20, then the substrate 12 and then the front portion 18. In this way, the solar cell 10 may be configured as a bifacial solar cell.

Each of the front and back portions 18, 20 comprises a plurality of layers which are arranged to define separate layered structures. The front portion 18 (also referred to herein as a front layered structure 18) is arranged opposite the front surface 14 of the substrate 12 and the back portion 20 (also referred to herein as a back layered structure 20) is arranged opposite the back surface 16 of the substrate 12. The constituent layers of the front and back layered structures 18, 20 are sequentially deposited (or e.g. diffused or implanted) onto the respective front and back surfaces 14, 16 of the substrate 12.

Each of the layers of the front and back portions 18, 20 are configured with a width, a length, and a depth. The width and length of each layer is measured in perpendicular directions that are aligned with the front and back surfaces 14, 16 of the substrate 12. For each layer, each of its width and length is substantially greater than its depth, which is measured in a direction that is perpendicular to the front and back surfaces 14, 16 of the substrate 12.

The solar cell 10 is a back junction solar cell (and, in particular, a back-junction heterojunction solar cell 10). As such the solar cell 10 is provided with a hole-collector 50 and an electron-collector 52 (i.e. electron/hole collector layers) arranged either side of the substrate 12. Accordingly, the hole-collector 50 forms part of the back portion 20 and the electron-collector 52 forms part of the front portion 18.

According to the illustrated embodiment, the substrate 12 is an n-type monocrystalline silicon wafer which forms a p-n junction with the p-type hole-collector 50. The electron-collector 52 is doped to be n-type, such that it is configured to extract electrons from the substrate 12. The hole and electron collectors 50, 52 are each formed of hydrogenated amorphous silicon (a-Si: H) material, which is doped with corresponding elements in order to achieve the prescribed conductivity type, as would be understood by the skilled person.

The front portion 18 comprises a front-passivation layer 28 (also referred to herein as a front-passivation region 28), which is interposed between the front surface 14 of the substrate 12 and the electron-collector 52. A back-passivation layer 30 (also referred to herein as a back-passivation region 30), of the back portion 20, is interposed between the hole-collector 50 and the back surface 16 of the substrate 12. The electron-collector 52 is arranged on a front surface 26 of the front-passivation region 28 and the hole-collector 50 is arranged on a back surface 36 of the back-passivation region 30, as shown in FIG. 1.

Each of the passivation regions 28, 30 are formed, generally, of an amorphous silicon material. However, the composition of each of the front and back-passivation regions 28, 30 is varied across its depth, as will be described in more detail below.

The electron and hole-collector 52, 50 each have a depth of 5 to 30 nm and the passivation regions 28, 30 each have a depth of 5 to 25 nm (as measured in the vertical direction shown in FIG. 1).

Figure 2:
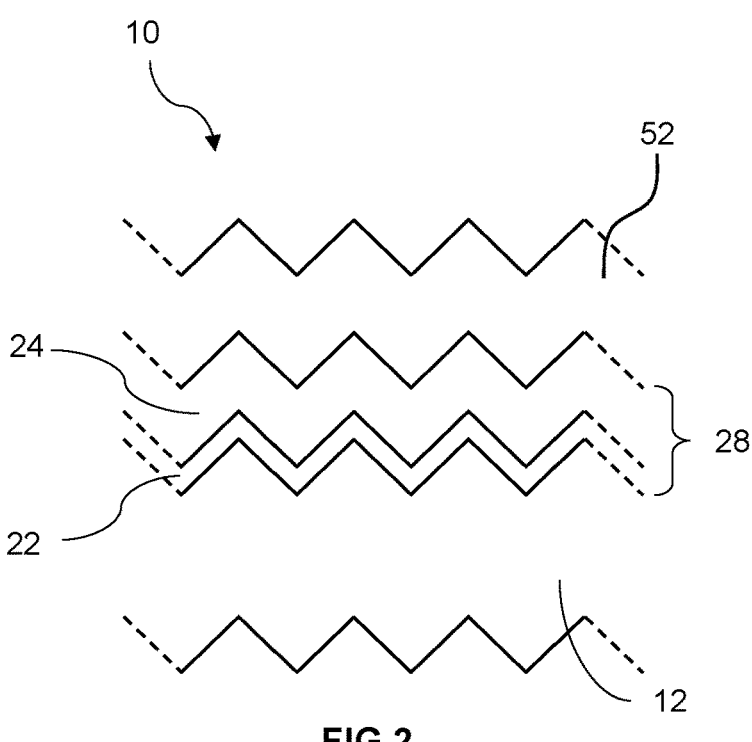
FIG. 2 is a close-up view of a front-passivation region of the solar cell of FIG. 1.
Figure 3:
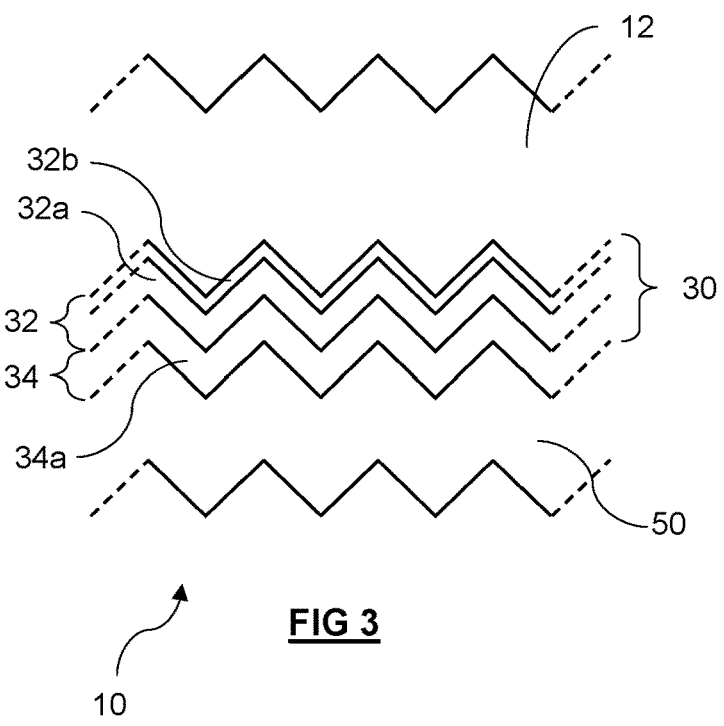
FIG. 3 is a close-up view of a back-passivation region of the solar cell of FIG. 1.

The solar cell 10 is further provided with a transparent-conductive oxide (TCO) layer 46, which is arranged at a front surface 54 of the electron-collector 52. A further TCO layer 48 is arranged at a back surface 44 of the hole-collector 50. The front and back surfaces of the substrate 12 are textured, as would be understood by the skilled person. The subsequent hole and electron-collector 50, 52 and the TCO layers 46, 48 each follow the textured profile of the substrate surfaces. Accordingly, the textured TCO layer 46, 48 provide an anti-reflective surface of the solar cell 10, as shown in FIGS. 1 to 3.

A front electrode 40 is provided at a front textured surface 56 of the front-TCO layer 46 and a back electrode 42 is provided at a back textured surface 58 of the back-TCO layer 48. The front and back electrodes 40, 42 are formed of silver. The front and back TCO layers 46, 48 each have a thickness of up to 100 nm and at least 10 nm, optionally up to 70 and at least 60 nm (as measured in the vertical direction shown in FIG. 1), and they are each formed of a transparent conductive oxide, such as indium tin oxide (ITO). The thickness of the back-TCO layer 48 may be less than the front-TCO layer 46.

The front and back passivation regions 28, 30 will now be described in more detail with reference to FIGS. 2 and 3, respectively.

The front-passivation region 28 comprises first and second front-passivation layers 22, 24, which each have different compositions. The second front-passivation layer 24 is interposed between the electron-collector 52 and the first front-passivation layer 22. The first front-passivation layer 22 is interposed between the second front-passivation layer 24 and the substrate 12, as shown in FIG. 2.

Each of the first and second front-passivation layers 22, 24 is configured with the same or a different hydrogen concentration. The hydrogen concentration refers to the amount of hydrogen atoms which have been introduced, or doped, into the amorphous silicon material of the corresponding layer.

The first front-passivation layer 22 is non-doped, i.e. intrinsic, and the second front-passivation layer 24 is doped n-type, such that it has the same conductivity type as the electron-collector 52. However, the dopant concentration of the second front-passivation layer 24 is substantially less than that of the electron-collector 52. Accordingly, the first front-passivation layer 22 defines a non-doped portion of the front-passivation region 28 and the second front-passivation layer 24 defines a micro-doped portion of the front-passivation region 28.

In contrast to the front-passivation region 28, the back-passivation region 30 includes a stack of three back layers 32a, 32b, 34a as shown in FIG. 3. A first back-passivation layer 32a is interposed between a second back-passivation layer 34a and the substrate 12. A third bac-passivation layer 32b is interposed between the first back-passivation layer 32a and the substrate 12, as shown in FIG. 3.

As with the front layers, each of the first, second and third back layers 32a, 34a, 32b are formed of amorphous silicon material. Also, the three back-passivation layers 32a, 32b, 34a are each formed of different materials. For example, whilst the hydrogen concentration level of the first and second back-passivation layers 32a, 34a is substantially the same, the hydrogen concentration level of the third back-passivation layer 32b is substantially less than that of the first and second layers 32a, 34a.

The first and third back-passivation layers 32b, 32a are non-doped, i.e. intrinsic, and the second back-passivation layer 34a is doped p-type, such that it has the same conductivity type as the hole-collector 50. The dopant concentration of the second back-passivation layer 34a is substantially less than that of the hole-collector 50. Accordingly, the second back-passivation layer 34a defines a micro-doped portion of the back-passivation region 30 (i.e. a micro-doped back-passivation portion 34). By contrast, the first and third back-passivation layers 32a, 32b together define a non-doped portion of the back-passivation region 30 (i.e. a non-doped back-passivation portion 32).

The first, second and third back-passivation layers 32a, 33a, 32b are configured with respective depths of approximately 5 nm, 6 nm and 3 nm (as measured in the vertical direction shown in FIGS. 2 and 3).

As described above, each of the layers 22, 24, 32a, 32a, 34a is formed of an amorphous silicon material. The structural, chemical and dopant concentration of these amorphous silicon materials is configured during the fabrication of the corresponding layer by adjusting the parameters of the corresponding deposition process, as is explained in more detail below.

Figure 4:
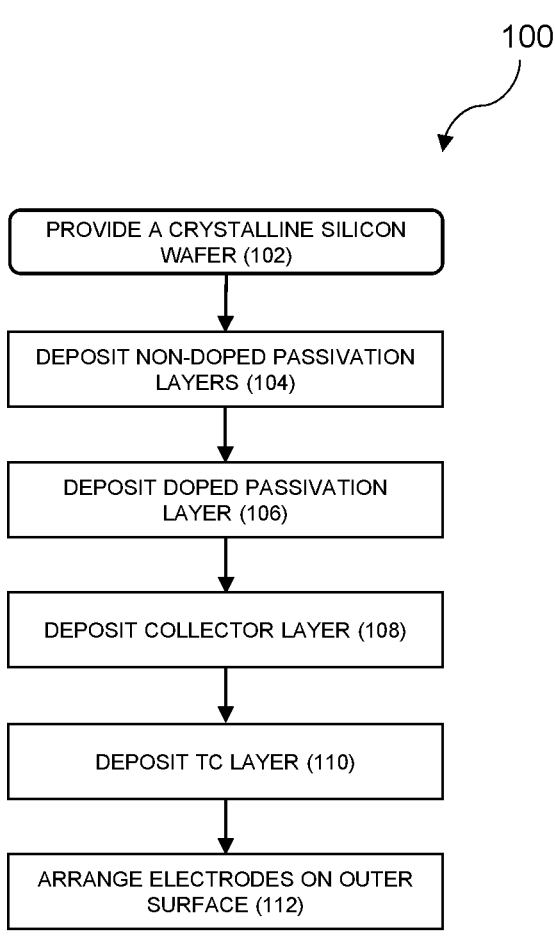
FIG. 4 is a flow chart illustrating a method of forming the solar cell of FIG. 1.

FIG. 4 depicts a method 100 of forming a solar cell, such as those described above. The method comprises a first step 102 of providing a crystalline silicon wafer to define the substrate 12 of the solar cell 10. The substrate 12 is arranged within a vapour deposition chamber and held under vacuum, as would be understood by the skilled person.

In a second method step 104, the method continues with the deposition of the non-doped back-passivation portion 32 (i.e. the first and third back-passivation layers 32a, 32b) onto the back surface 16 of the substrate 12. The method step 104 starts with depositing the third back-passivation layer 32b onto the back surface 16 of the substrate 12. Then, once the third back-passivation layer 32b is deposited, the method proceeds with depositing the first back-passivation layer 32a onto the back surface of the third back-passivation 32b.

A third method step 106 comprises depositing the micro-doped back-passivation portion 34 (i.e. the second back-passivation layer 34a) onto the back surface of the first back-passivation layer 32a.

A fourth step 104 comprises depositing the hole-collector 50 onto the back surface of the back-passivation region 30. Accordingly, the hole-collector 50 defines a back-collector layer of the solar cell 10.

The second, third and fourth method steps 104, 106, 108 involve arranging (or forming) layers of semiconductor material onto rear surface 16 of the silicon wafer substrate 12. This may comprise depositing, diffusing, doping and/or implantation steps. The layers referred to are those forming at least part of the rear portion 20 of the solar cell 10, as described above (e.g. the first, second and third back-passivation layers 32a, 34a, 32b and the hole-collector 50). Each of these steps involves depositing a corresponding semiconductor material using a vapour deposition process (e.g. PECVD).

In general, the parameters of the vapour deposition process are configured to determine the composition (e.g. structural and/or chemical) and also the dopant concentration of each layer. It is noted that a plasma may be formed within the deposition chamber during the deposition of each of the layers formed during method steps 104, 106 and 108;

however, at no point during these deposition process steps is there a separate hydrogen plasma etch treatment performed on any of the layers.

According to an exemplary arrangement of the invention, each of the layers of the front portion 18 of the solar cell 10 (e.g. the first and second front-passivation layers 22, 24 and the electron-collector 52) may be deposited using a similar method as described above in relation to the corresponding layers of the back portion 20. For example, the method steps 102 to 110 may be performed sequentially on the back side of the solar cell 10, before then performing the corresponding steps 102 to 110 on the front side of the solar cell 10. Alternatively, the front layers may be deposited before depositing the back layers, as would be understood by the skilled person.

According to a further alternative method, each of the layers of the front and back solar cell portions 18, 20 can be deposited according to any suitable order, or sequence. For example, the method may comprise depositing the first and third back-passivation layers 32a, 32b according to method step 104. The method may then proceed by depositing the first and second front-passivation layers 22, 24 of the front portion 18, according to method steps 104 and 106, respectively. The method may continue with the deposition of the second back-passivation layer 34a, according to method step 106.

It will be understood that each of the layers may also be deposited in a separate deposition chamber. According to an exemplary method, the back non-doped passivation portion (i.e. the first and third back-passivation layers 32a, 32b) may be deposited in a first deposition chamber, the first and second front-passivation layers 22, 24 may be deposited in a second deposition chamber, and the back micro-doped passivation portion (i.e. the second back-passivation layer 34a) may be deposited in the third deposition chamber.

With particular reference to the back portion 20 of the solar cell 10, the method of depositing the first, second and third back-passivation layers 32a, 34a and 32b involves using a first, second and third gas, respectively. The method of depositing the back-collector layer 50 (e.g. the hole-collector 50) comprises a fourth gas.

Each of the gases used to deposit the layers 32a, 32b, 34a and 50 is comprised of a plurality of gas species, or constituent gases. The constituent gases of each gas are mixed before being introduced into the deposition chamber. The first, second, third and fourth gases each comprise a silicon-based gas, such as $SiH_4$. At least one of the gases also comprises hydrogen (e.g. $H_2$).

The hydrogen concentration of the first gas is substantially equal to the hydrogen concentration of the second gas. The hydrogen concentration of the third gas is approximately 0 (i.e. substantially pure $SiH_4$). In particular, the method step 104 includes configuring the third gas such that the ratio of $H_2$ to $SiH_4$ is up 1, whereas the first and second gases are each configured such that their ratio of $H_2$ to $SiH_4$ is up 35 and/or at least 25. In an exemplary method, the ratio of $H_2$ to $SiH_4$ of the first and second gases is approximately 32 (e.g. 32), and the ratio of $H_2$ to $SiH_4$ of the third gas is approximately 0 (e.g. 0).

In this way, the first and second gases are configured such that the level of hydrogen gas which is introduced into the deposition chamber during the deposition of the first and second back-passivation layers 32a, 34a is at least an order of magnitude greater than that which is present during deposition of the third back-passivation layer 32b. Furthermore, the level of hydrogen gas which is introduced during the deposition of both the first and second back-passivation layers 32a, 34a is substantially the same. This results in the densification of the back-passivation region 30 towards its interface with the back-collector layer 50 (i.e. which is deposited thereon). The densification of the first and second back-passivation layers 32a, 34a thereby reduces the number of defect states in the back-passivation region 30 which thereby increases the fill factor of the solar cell 10.

The first and third gases are configured such that they do not comprise any dopant gases, which thereby ensures that the first and third back-passivation layers 32a, 32b are non-doped. In contrast, both the second and fourth gases comprise a positive dopant gas, such as $B_2H_6$, which leads to the second back-passivation layer 34a and the hole-collector 50 being positively doped.

During each of the method steps 104, 106, the flow rate of the dopant gas being introduced into the chamber are controlled in order to determine the respective dopant concentrations of the second back-passivation layer 34a and the hole-collector 50. As such, the method step 106 involves configuring the second gas so that the ratio of $B_2H_6$ to $SiH_4$ in the second gas is 0.01-0.1%, and the method step 108 includes configuring the fourth gas such that the ratio of $B2H_6$ to $SiH_4$ is 1-4%.

It will be appreciated that the second front-passivation layer 24 and the electron-collector 52 can both be deposited in a similar manner to that which is described above in relation to the second back-passivation layer 34a and the hole-collector 50, respectively. The principle difference is that the gases used to deposit the second front-passivation layer 24 and electron-collector layer 52 will comprise a negative dopant gas such as $PH_3$, which causes the layers to be negatively doped. The first front-passivation layer 22 may be deposited using a gas which doesn't comprise a dopant gas, similar to the first and third back-passivation layers 32a, 32b.

In the fifth method step 110, the method comprises depositing the front and back TC regions 46, 48 onto the electron and hole collectors 52, 50, respectively. This method step involves depositing front and back TC regions onto the front and back surfaces of the solar cell 10 using a DC magnetron sputtering process. In general, the parameters of the sputtering process are configured to determine the composition (e.g. structural and/or chemical) and also the electrical and optical properties of each layer.

Finally, a sixth method step 112 comprises arranging front and back electrodes 40, 42 onto the outermost surfaces of the front and back portions 18, 20 of the solar cell 10.

It will be understood that the invention is not limited to the embodiments above described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A method for manufacturing a solar cell, the method comprising providing a substrate, arranging a passivation region on a surface of the substrate and arranging a collector layer on a surface of the passivation region, the step of arranging the passivation region comprises;

depositing a first passivation layer on the surface of the substrate using a first gas; and, depositing a second passivation layer onto the surface of the first passivation layer using a second gas;

wherein the first and second gases each comprise hydrogen gas and a silicon-based gas, wherein the ratio of hydrogen gas to silicon-based gas of the second gas is up to 2.5, and at least 0.4, times the ratio of hydrogen gas to silicon-based gas of the first gas, wherein the second gas comprises a dopant gas, wherein the volume ratio of dopant gas to silicon-based gas in the second gas is up to 0.001, and at least 0.0001.

2. A method according to claim 1, wherein the method of arranging the passivation region does not comprise etching a surface of the first and/or second passivation layer with a hydrogen plasma.

3. A method according to claim 1, wherein the method comprises configuring the second gas such that the ratio of hydrogen gas to silicon-based gas is up to 50 and at least 20, optionally up to 35 and at least 25.

4. A method according to claim 1, wherein the method comprises configuring the first gas such that the ratio of hydrogen gas to silicon-based gas is up to 50 and at least 20, optionally up to 35 and at least 25.

5. A method according to claim 1, wherein the method comprises configuring the first gas such that the ratio of hydrogen gas to silicon-based gas is substantially the same as the ratio of hydrogen gas to silicon-based gas of the second gas.

6. A method according to claim 1, wherein the method comprises configuring the first passivation layer to be non-doped and configuring the second passivation layer with a conductivity type which is determined by the inclusion of dopant atoms.

7. A method according to claim 6, wherein the method comprises configuring the collector layer with the same conductivity type as the second passivation layer.

8. A method according to claim 7, wherein the method comprises doping at least one of the second passivation layer and the collector layer with the dopant gas, wherein the method comprises configuring a dopant concentration of the second passivation layer to be less than the dopant concentration of the collector layer.

9. A method according to claim 8, wherein the method comprises configuring the collector layer and the second passivation layer with a positive conductivity type.

10. A method according to claim 1, wherein the method comprises configuring at least one of the first passivation layer, the second passivation layer and the collector layer such that they are substantially comprised of amorphous silicon.

11. A method according to claim 1, wherein the method comprises depositing the passivation region onto a back surface of the substrate which is configured not to face a radiative source, when the solar cell is in use.

12. A method according to claim 1, wherein the method comprises configuring the first passivation layer with a depth of up to 10 nm and at least 3 nm, optionally 5 nm.

13. A method according to claim 1, wherein the method comprises configuring the second passivation layer with a depth of up to 10 nm and at least 3 nm, optionally 6 nm.

14. A method according to claim 1, wherein at least one deposition parameter of the first passivation layer is substantially the same as the at least one deposition parameter of the second passivation layer, the at least one parameter comprising at least one of a gas flow rate, a gas pressure, a temperature of the deposition chamber, and a power density of a plasma enhanced deposition process.

15. A method according to claim 1, wherein the passivation region comprises a third passivation layer interposed between the first passivation layer and the substrate, the method comprising depositing the third passivation layer onto the surface of the substrate using a third gas comprising hydrogen gas and a silicon-based gas; wherein the ratio of hydrogen gas to silicon-based gas of the third gas is up to 0.1 times the ratio of hydrogen gas to silicon-based gas of at least one of the first and second gases.

16. A method according to claim 15, wherein the method comprises configuring the third gas such that the ratio of hydrogen gas to silicon-based gas is up to 1, optionally substantially 0.

17. A method according to claim 1, wherein arranging the collector layer on the surface of the passivation region comprises depositing the collector layer using a fourth gas comprising hydrogen gas and a silicon-based gas, wherein the ratio of hydrogen gas to silicon-based gas of the fourth gas is substantially different to the ratio of hydrogen gas to silicon-based gas of at least one of the first and second gases.

18. A method according to claim 1, wherein the method comprises forming a heterojunction type (HJT) solar cell.

19. A solar cell manufactured according to the method of claim 1.

20. A solar cell according to claim 19, wherein the solar cell is configured to define a heterojunction type (HJT) solar cell.

* * * * *